United States Patent
Hayashi et al.

(10) Patent No.: US 8,288,062 B2
(45) Date of Patent: Oct. 16, 2012

(54) REFLECTIVE MASK BLANK FOR EUV LITHOGRAPHY

(75) Inventors: Kazuyuki Hayashi, Tokyo (JP); Toshiyuki Uno, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/346,026

(22) Filed: Jan. 9, 2012

(65) Prior Publication Data

US 2012/0107733 A1 May 3, 2012

Related U.S. Application Data

(63) Continuation of application No. PCT/JP2010/061560, filed on Jul. 7, 2010.

(30) Foreign Application Priority Data

Jul. 8, 2009 (JP) .................................. 2009-161607

(51) Int. Cl.
 G03F 1/22 (2012.01)
 G03F 1/24 (2012.01)
(52) U.S. Cl. .......................................................... 430/5
(58) Field of Classification Search .............. 430/5, 322; 428/428, 430; 378/35
 See application file for complete search history.

(56) References Cited

U.S. PATENT DOCUMENTS

| | | | |
|---|---|---|---|
| 5,641,593 A | 6/1997 | Watanabe et al. | |
| 7,390,596 B2 | 6/2008 | Ishibashi et al. | |
| 7,713,666 B2 | 5/2010 | Hayashi et al. | |
| 7,718,324 B2 | 5/2010 | Hayashi et al. | |
| 7,833,682 B2 | 11/2010 | Hayashi et al. | |
| 7,855,036 B2 | 12/2010 | Hayashi et al. | |
| 7,906,259 B2 | 3/2011 | Hayashi et al. | |
| 7,981,573 B2 * | 7/2011 | Ishibashi et al. | ................... 430/5 |
| 8,029,950 B2 | 10/2011 | Hayashi et al. | |
| 8,088,538 B2 | 1/2012 | Hayashi et al. | |
| 8,133,643 B2 | 3/2012 | Hayashi | |
| 8,137,872 B2 | 3/2012 | Hayashi | |
| 2006/0251973 A1 | 11/2006 | Takaki et al. | |
| 2011/0104595 A1 | 5/2011 | Hayashi et al. | |
| 2011/0200920 A1 | 8/2011 | Hayashi | |

FOREIGN PATENT DOCUMENTS

| | | |
|---|---|---|
| JP | 59-028158 | 2/1984 |
| JP | 07-114173 | 5/1995 |
| JP | 09-281692 | 10/1997 |
| JP | 2002-299227 | 10/2002 |
| JP | 2003-243292 | 8/2003 |
| JP | 2004-006798 | 1/2004 |
| JP | 2006-228766 | 8/2006 |

OTHER PUBLICATIONS

International Search Report issued Aug. 17, 2010 in PCT/JP2010/061560 filed Jul. 7, 2010.

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

Provision of a reflective mask blank for EUV lithography having an absorber layer having optical constants suitable for reducing the film thickness.

A reflective mask blank for EUV lithography comprising a substrate and a reflective layer for reflecting EUV light and an absorber layer for absorbing EUV light, that are formed in this order on the substrate;
 wherein the absorber layer contains at least one element selected from the group consisting of molybdenum (Mo), tin (Sn), silver (Ag), niobium (Nb) and titanium (Ti), and the absorber layer further contains palladium (Pd).

23 Claims, 1 Drawing Sheet

US 8,288,062 B2

REFLECTIVE MASK BLANK FOR EUV LITHOGRAPHY

This application is a continuation of PCT Application No. PCT/JP2010/061560 filed on Jul. 7, 2010, which is based upon and claims the benefit of priority from Japanese Patent Application No. 2009-161607 filed on Jul. 8, 2009. The contents of those applications are incorporated herein by reference in its entirety.

TECHNICAL FIELD

The present invention relates to a reflective mask blank for EUV (extreme ultraviolet) lithography used for producing a semiconductor or the like (in this description, it is referred to as "EUV mask blank"), and a reflective mask for EUV lithography produced by patterning an absorber layer of the reflective mask blank for EUV lithography (in this specification, it is referred to as "EUV mask").

BACKGROUND ART

In the semiconductor industry, a photolithography method using visible light or UV light has been employed as a technique of transcribing a fine pattern on a Si substrate or the like, which is required for forming an integrated circuit having such fine pattern. However, the microsizing of semiconductor devices has been accelerated, and on the other hand, the conventional photolithography method approaches the limit. In the photolithography method, it is said that the resolution limit for a pattern is about ½ of exposure wavelength and is about ¼ of exposure wavelength even if an immersion method is used. Even though the immersion method with an ArF laser (193 nm) is used, it is estimated that the limit is about 45 nm. Now, as an exposure technique for 45 nm or below, EUV lithography which is an exposure technique using EUV light having a further shorter wavelength than ArF laser has been considered to be promising. In this description, the EUV light indicates a ray having a wavelength in a soft X-ray region or a vacuum ultraviolet ray region, specifically, a ray having a wavelength of about 10 to 20 nm, particularly about 13.5 nm±0.3 nm.

The EUV light is apt to be absorbed by any substance and the refractive index of the substance at this wavelength is close to 1, and therefore, the conventional dioptric system such as one for photolithography using visible light or ultraviolet light cannot be employed. For this reason, a catoptric system, i.e. a reflective photomask (hereinafter referred to as "EUV mask") and a mirror are employed in the EUV light lithography.

A mask blank is a laminated member before patterning which is used for producing a photomask. The EUV mask blank has a reflective layer for reflecting EUV light and an absorber layer for absorbing EUV light which are formed in this order on a substrate such as glass or the like (refer to Patent Document 1). As the absorber layer, a material having a high absorption coefficient of EUV light, specifically, a material having Ta as the main component, is used.

Patent Document 1 describes that a nitride of tantalum boron alloy (TaBN), an oxide of tantalum boron alloy (TaBO) and an oxynitride of tantalum boron alloy (TaBNO) are preferred as the material for the absorber layer since they have high absorption coefficient of EUV light and low reflectivity for deep UV light in the wavelength region (190 nm to 260 nm) of pattern inspection light.

In recent years, the thickness of the absorber layer of EUV mask blank is preferably thin. In EUV lithography, exposure light is not incident from a perpendicular direction to an EUV mask but incident from a direction at an angle of a few degrees, usually 6 degrees, to the perpendicular direction. If the thickness of the absorber layer is thick, at a time of EUV lithography, a shadow of the exposure light is formed on a mask pattern formed by removing a part of the absorber layer by etching, and the pattern accuracy or the dimension accuracy of a mask pattern (hereinafter referred to as "transcription pattern") transcribed to a resist on a substrate such as a Si wafer by using the EUV mask, tends to be deteriorated. Since this problem becomes more significant as the line width of the mask pattern formed on the EUV mask becomes smaller, the thickness of the absorber layer of the EUV mask blank is required to be thinner.

For the absorber layer of the EUV mask blank, a material having a high absorption coefficient of EUV light is employed, and the thickness is ideally a thickness whereby EUV light incident into a surface of the absorber layer is completely absorbed. However, as described above, since the thickness of the absorber layer is required to be thin, it is not possible for the absorber layer to completely absorb EUV light incident into the layer, and a part of the incident light will be reflected from the layer.

The step of forming a transcription pattern of a resist on a substrate by EUV lithography requires the contrast of reflected light from the EUV mask, that is, the contrast between reflected light from a portion of the mask wherein the absorber layer is removed at a time of forming the mask pattern so that the reflective layer is exposed to the outside, and reflected light from a portion of the mask wherein the absorber layer is not removed at the time of forming the mask pattern. Accordingly, it has been considered that so long as a sufficient optical contrast of reflected light is obtained, there is no problem even if the incident EUV light is not completely absorbed by the absorber layer.

Based on the above concept, in order to reduce the thickness of the absorber layer, EUV masks using the principle of phase shift is proposed (refer to Patent Documents 2 and 3). They have characteristics that a portion from which the absorber layer is not removed at a time of forming a mask pattern has a reflectivity of from 5 to 15% for reflected light, and that reflected light from such a portion has a phase difference of 175 to 185° from reflected light from a portion where the absorber layer is removed at the time of forming the mask pattern so that the reflective layer is exposed to the outside. The documents describe that with the EUV masks, by using the principle of phase shift for reflected light from the absorber layer, it is possible to maintain a sufficient contrast to the reflective layer, and accordingly, it is possible to reduce the thickness of the absorber layer.

PRIOR ART DOCUMENTS

Patent Documents

Patent Document 1: JP-A-2004-6798 (U.S. Pat. No. 7,390,596)
Patent Document 2: JP-A-2006-228766
Patent Document 3: Japanese Patent No. 3,078,163 (U.S. Pat. No. 5,641,593)

DISCLOSURE OF INVENTION

Technical Problem

However, in a case of an absorber layer containing Ta as the main component described in Patent Document 1, the minimum thickness of the absorber layer is considered to be limited to 50 to 60 nm. At a time of reducing the thickness of the absorber layer, the minimum thickness deeply depends on the refractive index n and the extinction coefficient k of a metal being the main component.

In general, the phase difference between the reflective layer and the absorber layer is presented by the following formula.

$$\phi=4\pi(1-n)\times d\times\cos\theta/\lambda$$

Here, φ is the phase difference, n is the refractive index of the absorber layer, d is the film thickness of the absorber layer, θ is the incident angle of EUV light, and λ is the wavelength of EUV light.

When the above phase difference φ is 180° (=π), the reflective contrast is maximized. The film thickness on this condition is represented by the following formula.

$$d=\lambda/4(1-n)\times\cos\theta$$

Namely, as the refractive index n of the absorber layer is small, reduction of the thickness of the absorber layer is easy. For example, in a case of an absorber layer containing Ta as the main component, its refractive index is n≈0.945, and when the refractive index of the absorber layer is less than 0.945, further reduction of thickness is possible. Further, the extinction coefficient k is preferably from 0.020 to 0.080 in order to obtain a reflectivity of from 2 to 30%.

Accordingly, the absorber layer preferably has a refractive index of less than 0.945 and an extinction coefficient k of from 0.020 to 0.080 for the purpose of reducing the thickness.

Patent Document 2 describes the range of optimum optical constants for a halftone film, but there is no description in the document as to specific material. Meanwhile, Patent Document 3 describes that a preferred material is one type selected from the group consisting of V, Cr, Mn, Fe, Co, Ag, Cd, In, Sn, Sb, a lanthanoid element, Hf, Ta, W, Re, Os, Ir, Pt, Au, Ti, Pb and Bi; or a material containing at least one element in these elements. However, since the characteristics required for the absorber layer include not only optical characteristics for EUV light but also "surface roughness", "film stress", "crystalline state of each layer", "optical characteristics in wavelength range of pattern inspection light", etc. Accordingly, it is difficult for one type of metal alone to satisfy all characteristics, and it is important to form an alloy by combining several metals. Patent Document 3 is silent as to specific combination of materials.

In order to solve the above problems of prior arts, it is an object of the present invention to provide an EUV mask blank excellent in properties of EUV mask blank, which has an absorber layer having optical constants prospective for reduction of the thickness as compared with conventional absorber layers, and which satisfies various properties required for absorber layers such as "surface roughness", "film stress", "crystalline state of the layer" and "optical characteristics in wavelength region of pattern inspection light".

Solution to Problem

The present inventors have conducted extensive studies to solve the above problems, and as a result, they have discovered that when the absorber layer contains at least one element selected from the group consisting of molybdenum (Mo), tin (Sn), silver (Ag), niobium (Nb) and titanium (Ti), and further contains palladium (Pd), the absorber layer provides desired optical constants and satisfies various characteristics required for the absorber layer for an EUV mask blank.

The present invention has been made based on the above knowledge and provides a reflective mask blank for EUV lithography comprising a substrate and a reflective layer for reflecting EUV light and an absorber layer for absorbing EUV light, that are formed in this order on the substrate;

wherein the absorber layer contains at least one element selected from the group consisting of molybdenum (Mo), tin (Sn), silver (Ag), niobium (Nb) and titanium (Ti), and the absorber layer further contains palladium (Pd) (hereinafter referred to as "EUV mask blank of the present invention").

In the EUV mask blank of the present invention, it is preferred that in the absorber layer, the total content of molybdenum (Mo), tin (Sn), silver (Ag), niobium (Nb) and titanium (Ti) is from 20 to 90 at %, the content of palladium (Pd) is from 10 to 80 at %, and the total content of Mo, Sn, Ag, Nb, Ti and Pd is from 95 to 100 at %.

In this specification, "from - - - to - - - " means that the values - - - are included in the range unless otherwise specified.

In the EUV mask blank of the present invention, it is preferred that the absorber layer further contains nitrogen (N).

It is preferred that in the absorber layer, the total content of molybdenum (Mo), tin (Sn), silver (Ag), niobium (Nb) and titanium (Ti) is from 20 to 90 at %, the content of palladium (Pd) is from 10 to 80 at %, the content of nitrogen (N) is from 30 to 70 at %, and the total content of Mo, Sn, Ag, Nb, Ti, Pd and N is from 95 to 100 at %.

In the EUV mask blank of the present invention, it is preferred that the absorber layer further contains hydrogen (H).

It is preferred that in the absorber layer, the total content of molybdenum (Mo), tin (Sn), silver (Ag), niobium (Nb) and titanium (Ti) is from 20 to 90 at %, the content of palladium (Pd) is from 10 to 80 at %, the content of hydrogen (H) is from 0.1 to 10 at %, and the total content of Mo, Sn, Ag, Nb, Ti, Pd and H is from 95 to 100 at %.

In the EUV mask blank of the present invention, it is preferred that the absorber layer further contains nitrogen (N) and hydrogen (H).

It is preferred that in the absorber layer, the total content of molybdenum (Mo), tin (Sn), silver (Ag), niobium (Nb) and titanium (Ti) is from 20 to 90 at %, the content of palladium (Pd) is from 10 to 80 at %, the content of nitrogen (N) is from 30 to 70 at %, the content of hydrogen (H) is from 0.1 to 10 at %, and the total content of Mo, Sn, Ag, Nb, Ti, Pd, N and H is from 95 to 100 at %.

In the EUV mask blank of the present invention, it is preferred that the crystalline state of the absorber layer is amorphous.

Further, in the EUV mask blank of the present invention, it is preferred that the surface roughness (rms) of a surface of the absorber layer is at most 0.5 nm.

Further, in the EUV mask blank of the present invention, it is preferred that the thickness of the absorber layer is from 20 to 50 nm.

The EUV mask blank of the present invention preferably further comprises a low-reflective layer for inspection light to be used for inspection of mask pattern, that is formed on the absorber layer, and it is preferred that the low-reflective layer contains at least one element selected from the group consisting of molybdenum (Mo), tin (Sn), silver (Ag), niobium (Nb) and titanium (Ti), and the low-reflective layer contains palladium (Pd) and oxygen (O).

It is preferred that in the low-reflective layer, the total content of molybdenum (Mo), tin (Sn), silver (Ag), niobium (Nb) and titanium (Ti) is from 10 to 55 at %, the content of palladium (Pd) is from 10 to 60 at %, the content of oxygen (O) is from 20 to 70 at %, and the total content of Mo, Sn, Ag, Nb, Ti, Pd and O is from 95 to 100 at %.

Further, the EUV mask blank of the present invention preferably further comprises a low-reflective layer for inspection light to be used for inspection of mask pattern, that is formed on the absorber layer, and it is preferred that the low-reflective layer contains at least one element selected from the group consisting of molybdenum (Mo), tin (Sn), silver (Ag), niobium (Nb) and titanium (Ti), and the low-reflective layer further contains palladium (Pd), nitrogen (N) and oxygen (O).

It is preferred that in the low-reflective layer, the total content of molybdenum (Mo), tin (Sn), silver (Ag), niobium (Nb) and titanium (Ti) is from 10 to 55 at %, the content of palladium (Pd) is from 10 to 60 at %, the total content of nitrogen (N) and oxygen (O) is from 20 to 70 at %, the composition (atomic) ratio between O and N is O:N=9:1 to 1:9 and the total content of Mo, Sn, Ag, Nb, Ti, Pd, O and N is from 95 to 100 at %.

Further, when a low-reflective layer is formed on the absorber layer, the surface roughness (rms) of a surface of the low-reflective layer is preferably at most 0.5 nm.

Further, when a low-reflective layer is formed on the absorber layer, the thickness of the low-reflective layer is preferably from 5 to 30 nm.

Further, the EUV mask blank of the present invention preferably further comprises a protection layer for protecting the reflective layer at a time of patterning the absorber layer, that is formed between the reflective layer and the absorber layer, and it is preferred that the contrast between a reflected light from a surface of the protection layer and a reflected light from a surface of the low-reflective layer at the wavelength of light to be used for inspection of a pattern formed in the absorber layer, is at least 30%.

When a protection layer is formed between the reflective layer and the absorber layer, it is preferred that the protection layer is made of any one of Ru, an Ru compound and $SiO_2$.

When the low-reflective layer is formed on the absorber layer, it is preferred that the reflectivity of a surface of the low-reflective layer at a wavelength of light to be used for inspection of a pattern formed in the absorber layer, is at most 15%.

Advantageous Effects of Invention

In the EUV mask blank of the present invention, the absorber layer has a low refractive index value as compared with a conventional absorber layer containing Ta as the main component and has a desired extinction coefficient, whereby it is possible to reduce the thickness of the absorber layer as compared with a conventional absorber layer and it is expected that the shape accuracy and the dimension accuracy of a mask transcription pattern transcribed in a resist on a substrate such as a Si wafer will be improved.

DESCRIPTION OF EMBODIMENTS

In the following, the EUV mask blank of the present invention will be described with reference to drawings.

Figure 1:
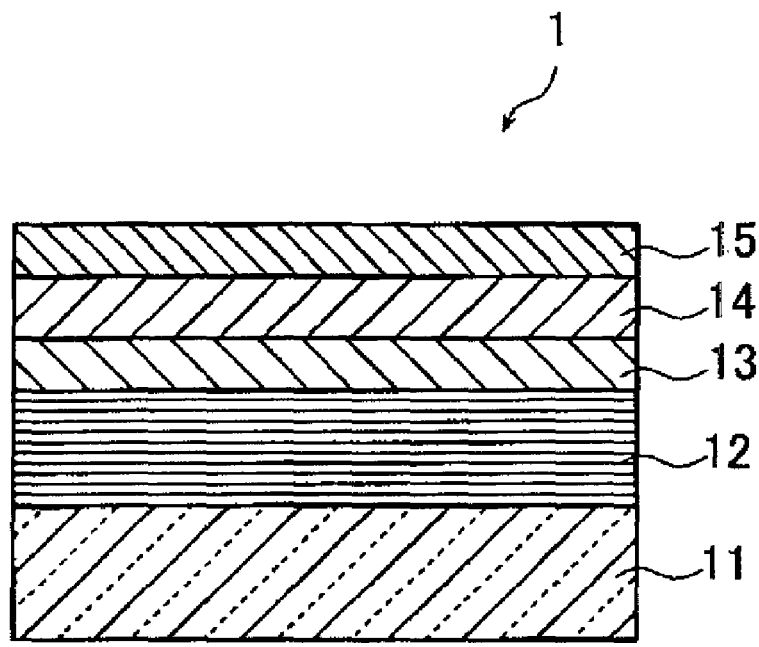
FIG. 1 is a cross-sectional view schematically showing a first embodiment of the EUV mask blank of the present invention.

FIG. 1 is a cross-sectional view schematically showing a first embodiment of the EUV mask blank of the present invention. In the mask blank 1 shown in FIG. 1, a reflective layer 12 for reflecting EUV light and an absorber layer 14 for absorbing EUV light are formed in this order on a substrate 11. Between the reflective layer 12 and the absorber layer 14, a protection layer 13 for protecting the reflective layer 12 at the time of forming a pattern in the absorber layer 14, is formed. On the absorber layer 14, a low-reflective layer 15 for inspection light for inspecting a mask pattern is formed. It is noted however that in the EUV mask blank 1 of the present invention, the substrate 11, the reflective layer 12 and the absorber layer 14 are essential in the structure shown in FIG. 1, and the protection layer 13 and the low-reflective layer 15 are optional structural elements.

Description will be made as to individual structural elements of the mask blank 1.

The substrate 11 is required to satisfy the characteristics that the substrate of EUV mask blank should possess. Accordingly, the substrate 11 has preferably a low thermal expansion coefficient (specifically $0\pm0.05\times10^{-7}/°$ C., particularly preferably $0\pm0.03\times10^{-7}/°$ C. at 20° C.), and be excellent in smoothness, flatness and durability against a cleaning liquid used for cleaning the mask blank or the photomask after the formation of a pattern. The substrate 11 can be glass having a low thermal expansion coefficient, specifically, $SiO_2$—$TiO_2$ glass. However, it is not limited to such glass, but a substrate of crystallized glass produced by precipitating a β quartz solid solution, quartz glass, silicon, metal or the like may be employed.

It is preferred that the substrate 11 has a smooth surface of at most 0.15 nm in terms of surface roughness (rms) and a flatness of at most 100 nm or less because the photomask after the formation of a pattern provides a high reflectivity and an accurate transcription.

The size or the thickness of the substrate 11 is determined appropriately depending on e.g. design values of the mask. In an example described later, a $SiO_2$–$TiO_2$ glass of 6 inches (152 mm) square in outer contour and of 0.25 inches (6.3 mm) thick was employed.

It is preferred that no defect exists in the surface of substrate 11 on which the reflective layer 12 is formed. Even in the case where a defect exists, the depth of a defect having a recess and the height of a defect having a projection should be at most 2 nm and the half width values of these defects of recess and projection be at most 60 nm so as not to cause a topological defect due to the defect of recess and/or the defect of projection.

The reflective layer 12 is not particularly limited as long as it has predetermined characteristics as the reflective layer for the EUV mask blank. Here, the reflective layer 12 is particularly required to have a high reflectivity for EUV ray. Specifically, when a ray in the wavelength region of EUV light is irradiated to the surface of the reflective layer 12 at an incident angle of 6°, the maximum value of the reflectivity for the ray having a wavelength of around 13.5 nm is preferably at least 60%, more preferably at least 65%. Even in a case of providing the protection layer 13 on the reflective layer 12, it is preferable that the maximum value of the reflectivity for the ray having a wavelength of around 13.5 nm is at least 60%, more preferably at least 65%.

The reflective layer 12 can achieve a high reflectivity for EUV light, and accordingly, a multilayer reflective film formed by laminating alternately a layer of high refractive index and a layer of low refractive index plural times is generally employed as the reflective layer 12. In this multilayer reflective film forming the reflective layer 12, Mo is widely employed for the layer of high refractive index and Si is widely used for the layer of low refractive index. Namely, a Mo/Si multilayer reflective film is most common. However, the multilayer reflective film is not limited thereto, but a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film may be employed.

The film thickness of each layer constituting the multilayer reflective film forming the reflective layer 12 and the number of the repeating units of the layers are properly determined depending on materials of the films used and the EUV ray reflectivity required for this reflective layer. Taking the Mo/Si reflective film as an example, and in order to form a reflective layer 12 wherein the maximum value of the EUV ray reflectivity is at least 60%, the multilayer reflective film can be formed by laminating a Mo layer having a film thickness of 2.3±0.1 nm and a Si layer having a film thickness 4.5±0.1 nm so that the number of repeating units becomes 30 to 60.

Each of the layers constituting the multilayer reflective film forming the reflective layer 12 is formed to have a desired thickness by using a known film deposition method such as magnetron sputtering method, ion beam sputtering method or the like. For example, when a Si/Mo multilayer reflective film is formed by using an ion beam sputtering method, a Si target is used as the target and an Ar gas (a gas pressure of $1.3\times10^{-2}$ Pa to $2.7\times10^{-2}$ Pa) is used as sputtering gas, and a Si film is formed to have a thickness of 4.5 nm under an ion acceleration voltage of 300 to 1,500 V and a film deposition rate of 0.03 to 0.30 nm/sec, and then, a Mo target is used as the target and an Ar gas (a gas pressure of $1.3\times10^{-2}$ Pa to $2.7\times10^{-2}$ Pa) is used as sputtering gas to deposit a Mo film having a thickness of 2.3 nm under an ion acceleration voltage of 300 to 1,500 V and a film deposition rate of 0.03 to 0.30 nm/sec. By taking the above-mentioned operation as one cycle, the Si film and the Mo film are laminated in 40 to 50 cycles to thereby obtain a Si/Mo multilayer reflective film.

It is preferred that in order to prevent the surface of the reflective layer 12 from being oxidized, the uppermost layer of the multilayer reflective film forming the reflective layer 12 is a layer of a material hardly oxidized. The layer of a material hardly oxidized functions as a cap layer for the reflective layer 12. As a specific example of the layer of a material hardly oxidized which functions as the cap layer, there is a Si layer. When the multilayer reflective film for the reflective layer 12 is a Si/Mo film, its uppermost layer should be a Si layer, so that the uppermost layer can function as the cap layer. In this case, the film thickness of the cap layer is preferably 11±2 nm.

The protection layer 13 is provided for the purpose as follows. When a pattern is formed in the absorber layer 14 by an etching process, normally by a dry etching process, the reflective layer 12 may suffer a damage by the etching process. Accordingly, the protection layer 13 is provided to protect the reflective layer 12. Therefore, the material which hardly suffers influence of the etching process to the absorber layer 14 is selected for the protection layer 13, namely, such a material that the etching rate to the protection layer is lower than that of the absorber layer 14 and that hardly suffers a damage by the etching process, is selected. The material satisfying this condition may be Al, a nitride thereof, Ru, a Ru compound (RuB, RuSi etc.), $SiO_2$, $Si_3N_4$, $Al_2O_3$ and a mixture thereof. Among these, it is preferred to use Ru, a Ru compound (RuB, RuSi etc.), and $SiO_2$. Here, as described later, in the EUV mask blank of the present invention, since the absorber layer contains Pd, the material of the protection layer 13 is particularly preferably Ru or a Ru compound (RuB, RuSi etc.) for the reason of etching resistance. Namely, for etching of an absorber layer containing Pd like the absorber layer 14 of the present invention, a dry etching process using a fluorine type gas ($CF_4$, $CF_3H$) is preferably employed. And a protection layer 13 composed of Ru and a Ru compound has a sufficient etching resistance against such a dry etching process using a fluorine type gas, whereby etching damage is reduced, such being preferred.

Further, the protection layer 13 preferably contains no Ta and no Cr for the purpose of preventing increase of film stress. The contents of Ta and Cr in the protection layer 13 are each preferably at most 5 at %, particularly preferably at most 3 at %, still more preferably the protection layer 13 contains no Ta and no Cr.

The thickness of the protection layer 13 is preferably from 1 to 60 nm, particularly preferably from 1 to 10 nm.

The protection layer 13 is formed by using a known deposition method such as a magnetron sputtering method or an ion beam sputtering method. When a Ru film is deposited by the magnetron sputtering method, it is preferred that the film is deposited so as to have a thickness of 2 to 5 nm, by using a Ru target as the target, using an Ar gas (a gas pressure of $1.0\times10^{-2}$ Pa to $10\times10^{-1}$ Pa) as the sputtering gas, applying a voltage of 30 to 1,500 V and setting the film deposition rate to be 0.02 to 1.0 nm/sec.

The characteristic particularly required for the absorber layer 14 is high contrast between EUV light reflected by the reflective layer 12 and EUV light reflected by the absorber layer 14. In a case of an EUV mask maintaining the contrast between the absorber layer 14 and the reflective layer 12 not only by absorbing EUV rays by the absorber layer 14 alone but also by using the principle of phase shift, as described above, it is necessary that the refractive index n and the extinction coefficient k of the absorber layer are predetermined values, and n is preferably less than 0.945, more preferably less than 0.930, still more preferably less than 0.920. k is preferably from 0.020 to 0.080, more preferably from 0.025 to 0.078, still more preferably from 0.030 to 0.075.

When the absorber layer 14 of the EUV mask blank 1 of the present invention contains at least one element selected from the group consisting of molybdenum (Mo), tin (Sn), silver (Ag), niobium (Nb) and titanium (Ti) and contains palladium (Pd), the above characteristics are achieved. Here, among these elements, Mo, Sn, Nb and Ti are preferred in terms of the mechanical strength of the absorber layer.

Further, in order to use the principle of phase shift, the reflectivity of a surface of the absorber layer 14 for EUV light, specifically, the maximum value of the reflectivity for a light beam having a wavelength in the vicinity of 13.5 nm when the light beam in the wavelength region of EUV light is incident into the surface of the absorber layer 14 at an incident angle of 6°, is preferably from 5 to 15%.

Here, in a case of forming a low-reflective layer 15 on the absorber layer 14, the reflectivity of a surface of the low-reflective layer 15 for EUV light preferably satisfy the above range.

The content of Pd in the absorber layer 14 is preferably from 10 to 80 at %, particularly preferably from 15 to 75 at %, still more preferably from 15 to 70 at % for the reason that it is possible to control the optical constants to be ones (n<0.945, k=0.030 to 0.080) suitable to reduce the thickness of the absorber layer.

Further, in the absorber layer 14, the total content of at least one element selected from the group consisting of molybdenum (Mo), tin (Sn), silver (Ag), niobium (Nb) and titanium (Ti) is preferably from 20 to 90 at %, particularly preferably from 25 to 85 at %, still more preferably from 30 to 85 at % for the reason that it is possible to control the surface roughness of the absorber layer, the film stress, the crystalline state of the layer and the optical characteristics in the wavelength region of pattern inspection light to be within desired ranges to be described later.

Here, the total content of Mo, Sn, Ag, Nb, Ti and Pd in the absorber layer 14 is preferably from 95 to 100 at %, more preferably from 97 to 100 at %, still more preferably from 99 to 100 at %.

Further, the absorber layer 14 preferably contains no Ta and no Cr for the purpose of preventing increase of the film stress. The contents of Ta and Cr in the albsorber layer 14 are each preferably at most 5 at %, particularly preferably at most 3 alt %, still more preferably the absorber layer 14 contains no Ta and no Cr.

The absorber layer 14 may further contain nitrogen (N), and when it contains N, an effect of improving the surface roughness can be obtained. When the absorber layer contains N, the content of N is preferably from 30 to 70 at %, particularly preferably from 35 to 60 at % for the reason that the surface of the absorber layer becomes smooth.

When the absorber layer 14 contains N, the total content of Mo, Sn, Ag, Nb, Ti, Pd and N in the absorber layer 14 is preferably from 95 to 100 at %, more preferably from 97 to 100 at %, still more preferably from 99 to 100 at %.

The absorber layer 14 may further contain hydrogen (H), and when it contains H, an effect of making the crystalline state amorphous is obtained. When the absorber layer 14 contains H, the content of H is preferably from 0.1 to 10 at %, particularly preferably from 0.1 to 5 at % for the reason that it is possible to make the crystalline state of the absorber layer amorphous and it is possible to make the surface roughness of the absorber layer smooth.

When the absorber layer 14 contains H, the total content of Mo, Sn, Ag, Nb, Ti, Pd and H in the absorber layer 14 is preferably from 95 to 100 at %, more preferably from 97 to 100 at %, still more preferably from 99 to 100 at %.

When the absorber layer contains N and H, the total content of these elements is preferably from 30 to 70 at %, particularly preferably from 35 to 60 at % for the reason that it is possible to make the crystalline state of the absorber layer amorphous and to make the surface roughness of the absorber layer smooth.

Further, the composition (atomic) ratio between N and H is preferably from N:H=14:1 to 9:1, particularly preferably from 13:2 to 9:1 for the reason that it is possible to make the crystalline state of the absorber layer amorphous and to make the surface roughness of the absorber layer smooth.

When the absorber layer 14 contains N and H, the total content of Mo, Sn, Ag, Nb, Ti, Pd, N and H in the absorber layer 14 is preferably from 95 to 100 at %, more preferably from 97 to 100 at %, still more preferably from 99 to 100 at %.

Further, the content of oxygen in the absorber layer 14 is preferably at most 5 at %, particularly preferably at most 3 at % for the purpose of preventing the absorber layer from being insulative. Further, the content of oxygen in the protection layer 13 is also preferably at most 5 at %, particularly preferably at most 3 at %.

When the absorber layer 14 has the above construction, its crystalline state is preferably amorphous. In this specification, a phrase "crystalline state is amorphous" includes not only an amorphous structure having no crystal structure but also fine crystal structure. When the absorber layer 14 is a film having an amorphous structure or a film having fine crystalline structure, a surface of the absorber layer 14 is excellent in smoothness.

Here, although the absorber layer according to the present invention is a film containing at least one element selected from the group consisting of molybdenum (Mo), tin (Sn), silver (Ag), niobium (Nb) and titanium (Ti) and contains palladium (Pd), that is a film containing only metals (namely, containing no such material as B or Si which tends to make the film state amorphous), it is possible to make the crystalline state of the film amorphous, such being preferred.

In the EUV mask blank 1 of the present invention, since the absorber layer 14 is a film of amorphous structure or a film of fine crystal structure, the surface roughness (rms) of a surface of the absorber layer 14 is preferably at most 0.5 nm. Here, the surface roughness of a surface of the absorber layer 14 can be measured by using an atomic force microscope. When the surface roughness of the surface of the absorber layer 14 is large, the edge roughness of a pattern to be formed in the absorber layer 14 becomes large, and the dimension accuracy of the pattern becomes poor. Since the influence of edge roughness becomes significant as the pattern becomes fine, the surface of the absorber layer 14 is required to be smooth.

When the surface roughness (rms) of the surface of the absorber layer 14 is at most 0.5 nm, the surface of the absorber layer 14 is sufficiently smooth and there is no risk that the dimension accuracy of the pattern is deteriorated by the effect of edge roughness. The surface roughness (rms) of the surface of the absorber layer 14 is more preferably at most 0.4 nm, still more preferably at most 0.3 nm.

Here, in a reflective mask blank for EUV lithography of the present invention constituted by a substrate and a reflective layer reflecting EUV light and the above unique absorber layer of the present invention absorbing EUV light, that are formed in this order on the substrate, when a low-reflective layer is further formed on the surface of the absorber layer, the surface roughness of the surface of the absorber layer means the surface roughness of the absorber layer before forming the low-reflective layer. When the low-reflective layer is formed on a surface of the absorber layer, the surface roughness of the surface of the absorber layer itself may be regarded to be substantially maintained without having a change. Accordingly, the value of the roughness of a surface of the low-reflective layer formed on the surface of the absorber layer measured by an atomic force microscope, may be regarded to be substantially equal to the surface roughness of a surface of the absorber layer itself.

Here, it is possible to confirm by X-ray refraction (XRD) method that the crystalline state of the absorber layer 14 is amorphous, that is, it has an amorphous structure or a fine crystal structure. When the crystalline state of the absorber layer 14 is an amorphous structure or a fine crystal structure, no sharp peak is observed in diffraction peaks obtained by XRD measurement.

The film stress in the absorber layer 14 is preferably within ±200 MPa, particularly preferably within ±180 MPa since the shape accuracy or the dimension accuracy of a mask transcription pattern to be transcribed in a resist on a substrate such as a Si wafer is not deteriorated in such ranges.

The thickness of the absorber layer 14 is preferably from 20 to 50 nm, particularly preferably from 20 to 45 nm, still more preferably from 20 to 40 nm since the shape accuracy or the dimension accuracy of a mask transcription pattern to be transcribed into a resist on a substrate such as a Si wafer is expected to be improved in such ranges.

The absorber layer 14 having the above construction can be formed by carrying out a sputtering method by using a target containing at least one element selected from the group consisting of Mo, Sn, Ag, Nb and Ti and containing Pd. Here, use of a target containing at least one element selected from the group consisting of Mo, Sn, Ag, Nb and Ti and containing Pd, includes use of at least two types of metal targets that are a target made of a metal of at least one element selected from the group consisting of Mo, Sn, Ag, Nb and Ti and a Pd target, and use of a compound target containing at least one element selected from the group consisting of Mo, Sn, Ag, Nb and Ti and containing Pd.

Here, the use of at least two types of metal targets is convenient to adjust the composition components of the absorber layer 14. In a case of using a compound target, it is preferred that the target composition is adjusted in advance so that an absorber layer 14 to be formed has a desired composition.

The sputtering method using the above target is carried out in an inert gas atmosphere containing at least one of helium (He), argon (Ar), neon (Ne), krypton (Kr) and xenon (Xe). Here, in a case of forming an absorber layer containing N, the sputtering method is carried out in an inert gas atmosphere containing at least one of He, Ar, Ne, Kr and Xe and containing nitrogen ($N_2$). Further, in a case of forming an absorber layer containing H, a sputtering method is carried out in a gas atmosphere containing at least one of inert gases He, Ar, Ne, Kr and Xe and containing hydrogen ($H_2$). Further, in a case of forming an absorber layer containing H and N, a sputtering method is carried out in a gas atmosphere containing at least one of inert gases He, Ar, Ne, Kr and Xe and containing hydrogen ($H_2$) and nitrogen ($N_2$).

Using a case where the inert gas atmosphere is Ar gas atmosphere as an example, the forming conditions of the absorber layer are shown below.

Forming Conditions of Absorber Layer

Sputtering gas: Ar (gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa.).

Input power: from 30 to 1000 W, preferably from 50 to 750 W, more preferably from 80 to 500 W.

Film deposition rate: from 0.5 to 60 nm/min, preferably from 1.0 to 45 nm/min, more preferably from 1.5 to 30 nm/min.

Here, in the above, a case where the sputtering gas is Ar is described, but in a case of using an inert gas other than Ar or a plurality of inert gases as the sputtering gas, the total concentration of the inert gases is set to be the same concentration range as the above concentration of Ar gas.

The low-reflective layer 15 is made of a film which shows low reflection for the inspection light used for inspecting a mask pattern. In the production of an EUV mask, after a pattern was formed in the absorber layer, an inspection is conducted whether or not this pattern has been correctly formed according to a predetermined design. In the inspection of the mask pattern, an inspection apparatus using light of about 257 nm as inspection light, is usually employed. Namely, it detects the difference of reflectivity for the light of about 257 nm. Specifically, the inspection is conducted to find the difference of reflectivity between the surface which appears after the absorber layer 14 has been removed by forming a pattern and the surface of the absorber layer 14 remained without being removed by the pattern formation. Here, the former indicates the surface of the reflective layer 12 or the surface of the protection layer 13 and usually it indicates the surface of the protection layer 13. Accordingly, in a case of small difference of reflectivity between the surface of the reflective layer 12 or the surface of the protection layer 13 and the surface of the absorber layer 14 at the wavelength of the inspection light, the contrast in the inspection is not good and a correct inspection result is not obtainable. The low-reflective layer is preferably adjacent to the absorber layer and is preferably the outermost layer from the viewpoint of pattern inspection.

The absorber layer 14 having the above-mentioned structure has an extremely low EUV light beam reflectivity and excellent characteristics as an absorber layer for the EUV mask blank 1. However, when inspection light having a certain wavelength is used, the light beam reflectivity cannot always be sufficiently low. As a result, there is a case where the difference between the reflectivity at the surface of the absorber layer 14 and the reflectivity of the surface of the absorber layer 12 or the surface of the protection layer 13 at the wavelength of inspection light is small, whereby there is a possibility that a sufficient contrast is not obtainable in the inspection. When a sufficient contrast cannot be obtained in the inspection, a defect of a pattern in the inspection of mask pattern cannot sufficiently be discriminated, so that a correct defect-finding inspection cannot be carried out.

In the EUV mask blank 1 of the present invention, by forming a low-reflective layer 15 for inspection light on the absorber layer 14, the light beam reflectivity at the wavelength of inspection light becomes extremely low, whereby the contrast at the time of inspection is improved. Specifically, when a light beam in the wavelength region of inspection light is incident on a surface of the low-reflective layer 15, the maximum light beam reflectivity at the wavelength of inspection light is preferably at most 15%, more preferably at most 10%, still more preferably at most 5%.

When the light beam reflectivity of the low-reflective layer 15 at the wavelength of inspection light is at most 15%, the contrast at the time of inspection is good. Specifically, the contrast between the reflected light having the wavelength of inspection light from the surface of the reflective layer 12 or the surface of the protection layer 13 and the reflected light having the wavelength of inspection light from the surface of the low-reflective layer 15, becomes at least 30%.

In this specification, the contrast can be obtained by the following formula.

$$\text{Contrast}(\%) = ((R_2 - R_1)/(R_2 + R_1)) \times 100$$

Figure 2:
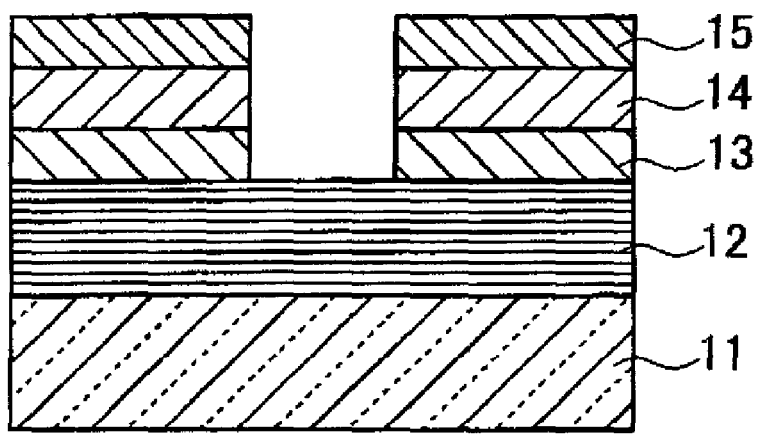
FIG. 2 shows a state that a pattern is formed in the absorber layer 14 (and the low-reflective layer 15) of the EUV mask blank 1 shown in FIG. 1.

Here, $R_2$ at the wavelength of inspection light is the reflectivity of a surface of the reflective layer 12 or a surface of the protection layer 13, and $R_1$ is the reflectivity of a surface of the low-reflective layer 15. Here, the above $R_1$ and $R_2$ are measured in a state that, as shown in FIG. 2, a pattern is formed in the absorber layer 14 (or the low-reflective layer 15) of the EUV mask blank 1 of FIG. 1. The above $R_2$ is a value measured at a surface of the reflective layer 12 or a surface of the protection layer 13 exposed to the outside in a portion where the absorber layer 14 and the low-reflective layer 15 are removed by patterning, and $R_1$ is a value measured at a surface of the low-reflective layer 15 remained without being removed by the patterning.

When the EUV mask blank of the present invention has the low-reflective layer, the contrast represented by the above formula is preferably at least 45%, more preferably at least 60%, particularly preferably at least 80%.

In order to achieve the above characteristic, the low-reflective layer 15 is preferably constituted by a material having a refractive index at the wavelength of inspection light lower than that of the absorber layer 14, and the crystalline state is preferably amorphous.

When the low-reflective layer 15 of the EUV mask blank 1 of the present invention contains at least one element selected from the group consisting of Mo, Sn, Ag, Nb and Ti and contains Pd and contains oxygen (O) or O and N, it is possible to achieve the above characteristic. The content of Pd in the low-reflective layer 15 is preferably from 10 to 60 at %, particularly preferably from 10 to 50 at % for the reason that the optical characteristic in the wavelength region of pattern inspection light can be controlled in the region.

Further, in the low-reflective layer, the total content of at least one element selected from the group consisting of Mo, Sn, Ag, Nb and Ti is preferably from 10 to 55 at %, particularly preferably from 10 to 45 at % for the reason that the surface roughness and the crystal structure of the low-reflective layer can be controlled in that region.

Further, when the low-reflective layer 15 contains O, the content of O is preferably from 20 to 70 at %, particularly preferably from 20 to 60 at % for the reason that the optical characteristics in the wavelength region of pattern inspection light can be controlled in the region. Here, when the low-reflective layer 15 contains O, the total content of Mo, Sn, Ag, Nb, Ti, Pd and O in the low-reflective layer 15 is preferably from 95 to 100 at %, more preferably from 97 to 100 at %, still more preferably from 99 to 100 at %.

Further, when the low-reflective layer 15 contains O and N, the total content of O and N is preferably from 20 to 70 at %, particularly preferably from 20 to 60 at % for the reason that the optical characteristics in the wavelength region of pattern inspection light can be controlled in the region. Further, the composition (atomic) ratio between O and N is preferably from O:N=9:1 to 1:9 for the reason that the optical characteristics in the wavelength region of pattern inspection light can be controlled in the region. Here, when the low-reflective layer 15 contains O and N, the total content of Mo, Sn, Ag, Nb, Ti, Pd, N and O in the low-reflective layer 15 is preferably from 95 to 100 at %, more preferably from 97 to 100 at %, still more preferably from 99 to 100 at %.

Further, the low-reflective layer preferably contains at least one element selected from the group consisting of tantalum (Ta), silicon (Si) and hafnium (Hf) and at least one element selected from the group consisting of oxygen (O) and nitrogen (N). Further, the total content of tantalum (Ta), silicon (Si) and hafnium (Hf) is preferably from 10 to 55 at %, the content of oxygen (O) and nitrogen (N) is preferably from 45 to 90 at %, and the total content of Ta, Si, Hf, O and N is preferably from 95 to 100 at %. With such a low-reflective layer, a mask having more low reflectivity can be produced.

When the low-reflective layer 15 has the above construction, its crystalline state is amorphous and its surface is excellent in smoothness. Specifically, the surface roughness (rms) of a surface of the low-reflective layer 15 is at most 0.5 nm.

As described above, in order to prevent deterioration of dimension accuracy of a pattern due to the influence of edge roughness, a surface of the absorber layer 14 is required to be smooth. Since the low-reflective layer 15 is formed on the absorber layer 14, the surface of the low-reflective layer 15 is required to be smooth for the same reason.

When the surface roughness (rms) of the surface of the low-reflective layer 15 is at most 0.5 nm, the surface of the low-reflective layer 15 is sufficiently smooth and there is no risk that the dimension accuracy of a pattern is deteriorated due to the effect of edge roughness. The surface roughness (rms) of the surface of the low-reflective layer 15 is more preferably at most 0.4 nm, still more preferably at most 0.3 nm.

Here, from the viewpoint of reducing the surface roughness, the low-reflective layer 15 preferably contains N.

Here, it is possible to confirm that the crystalline state of the low-reflective layer 15 is amorphous, that is, the crystalline state is an amorphous structure or a fine crystal structure, can be confirmed by X-ray diffraction (XRD) method. When the crystalline state of the low-reflective layer 15 is an amorphous structure or a fine crystal structure, no sharp peak is observed in diffraction peaks obtained by an XRD measurement.

When the low-reflective layer 15 is formed on the absorber layer 14, the total film thickness of the absorber layer 14 and the low-reflective layer 15 is preferably from 25 to 80 nm. Further, when the thickness of the low-reflective layer 15 is larger than the thickness of the absorber layer 14, the EUV light absorption characteristic of the absorber layer 14 may decrease. Accordingly, the thickness of the low-reflective layer 15 is preferably smaller than the thickness of the absorber layer. For this reason, the thickness of the low-reflective layer 15 is preferably from 5 to 30 nm, more preferably from 10 to 20 nm.

The low-reflective layer 15 having the above construction can be formed by carrying out a sputtering method using a target containing at least one element selected from the group consisting of Mo, Sn, Ag, Nb and Ti and a target containing Pd. Here, as the targets, the above at least two types of metal targets or a compound target may be employed.

Here, use of at least two types of metal targets is suitable for adjusting the composition components of the low-reflective layer 15. On the other hand, in a case of using a compound target, the target composition is preferably adjusted in advance so that a low-reflective layer 15 to be formed has a predetermined composition.

The sputtering method using the above target(s) is carried out in an inert gas atmosphere in the same manner as the sputtering method for the purpose of forming the absorber layer.

Here, when the low-reflective layer 15 contains oxygen (O), the sputtering method is carried out in a gas atmosphere containing at least one inert gas of He, Ar, Ne, Kr and Xe and containing O. When the low-reflective layer 15 contains O and N, the sputtering method is carried out in a gas atmosphere containing at least one inert gas of He, Ar, Ne, Kr and Xe and containing O and N.

Specific conditions of the sputtering method change according to a target employed or the composition of an inert gas atmosphere in which the sputtering method is carried out. However, in any case, it is sufficient that the sputtering method is carried out under the following conditions.

Using a case where the inert gas atmosphere is a mixed gas atmosphere of Ar and $O_2$, the forming conditions of the low-reflective layer are shown below.

Deposition Conditions of Low-reflective Layer
  Atmosphere pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa.
  Sputtering gas: Mixed gas of Ar and $O_2$ ($O_2$ gas concentration: from 3 to 80 vol %, preferably from 5 to 60 vol %, more preferably from 10 to 40 vol %.
  Input power: from 30 to 1000 W, preferably from 50 to 750 W, more preferably from 80 to 500 W.
  Film deposition rate: from 0.01 to 60 nm/min, preferably from 0.05 to 45 nm/min, more preferably from 0.1 to 30 nm/min.

Here, in a case of using an inert gas other than argon or a plurality of inert gases, the total concentration of these inert gases is set to be the same concentration range as that of the above Ar gas concentration. Further, when the inert gas atmosphere contains $N_2$ and $O_2$, their total concentration is set to be the same concentration range as that of the above oxygen concentration.

Here, in the EUV mask blank 1 of the present invention, the reason why the low-reflective layer 15 is preferably formed on the absorber layer 14 is because the wavelength of pattern inspection light is different from the wavelength of EUV light. Accordingly, in a case of using EUV light (in the vicinity of 13.5 nm) as a pattern inspection light, it is considered to be not necessary to form the low-reflective layer 15 on the absorber layer 14. The wavelength of inspection light tends to shift to the short wavelength side as the pattern size becomes small, and it is considered to shift to 193 nm and further to 13.5 nm in the future. When the wavelength of inspection light is 13.5 nm, it is considered to be not necessary to form the low-reflective layer 15 on the absorber layer 14.

The EUV mask blank 1 of the present invention may have a known functional film in the field of EUV mask blank other than the reflective layer 12, the protection layer 13, the absorber layer 14 and the low-reflective layer 15. A specific example of such a functional film may, for example, be a high dielectric coating to be provided on a rear side of a substrate to promote electrostatic chucking of the substrate described in JP-A-2003-501823. Here, the rear side of the substrate means a face of the substrate 11 in FIG. 1 opposite from a face on which the reflective layer 12 is formed. The electric conductivity and the thickness of the material constituting the high dielectric coating to be provided on the rear face of the substrate for such a purpose, are selected so that the sheet resistance becomes $100\Omega/\square$. The material constituting the high dielectric coating may be widely selected from ones described in known documents. For example, the high dielectric coating described in JP-A-2003-501823, specifically, a coating comprising silicon, TiN, molybdenum, chromium or TaSi may be applied. The thickness of the high dielectric coating may, for example, be from 10 to 1000 nm.

The high dielectric coating can be formed by using a known film-deposition method, for example, a sputtering method such as magnetron sputtering method or ion beam sputtering method, CVD method, vacuum vapor deposition method or electrolytic plating method.

By patterning at least the absorber layer of the mask blank of the present invention, it is possible to produce an EUV mask. The patterning method of the absorber layer is not particularly limited, and for example, a method of applying a resist on the absorber layer to form a resist pattern and etching the absorber layer using the resist pattern as a mask, may be employed. The material of the resist or the method of writing the resist pattern may be appropriately selected considering e.g. the material of the absorber layer. The method for etching the absorber layer is also not particularly limited, and a dry etching such as reactive ion etching or a wet etching can be employed. After patterning the absorber layer, the resist is removed by a remover fluid to obtain an EUV mask.

A production process of a semiconductor integrated circuit by using the EUV mask of the present invention will be described. The present invention can be applied to a production process of a semiconductor integrated circuit using a photolithography method using EUV light as exposure light source. Specifically, a substrate such as a silicon wafer coated with a resist is disposed on a stage, and the above EUV mask is mounted on a reflection type exposure apparatus constituted by combining reflective mirrors. Then, the EUV light emitted from a light source is incident to the EUV mask via reflective mirrors, and the EUV light is reflected by the EUV mask and is incident to the substrate coated with the resist. By this pattern transcription step, a circuit pattern is transcribed on the substrate. The substrate on which the circuit pattern is transcribed is subjected to a developing step, exposed portion or no-exposed portion is etched, and the resist is removed. The semiconductor integrated circuit is produced by repeating such steps.

EXAMPLES

In the following, the present invention will be further described with reference to Examples.

Example 1

In this Example, the EUV mask blank 1 shown in FIG. 1 was prepared.

A $SiO_2$—$TiO_2$ type glass substrate (outer dimensions: 6 inches (152 mm) square and thickness: 6.3 mm) was used as the substrate 11 for depositing a film. This glass substrate has a thermal expansion coefficient of $0.2\times10^{-7}/°$ C., a Young's modulus of 67 GPa, a Poisson's ratio of 0.17 and a specific rigidity of $3.07\times10^7$ $m^2/s^2$. This glass substrate was polished so that a smooth surface having a surface roughness (rms) of at most 0.15 nm and a flatness of at most 100 nm was formed.

On the rear side of the substrate 11, a Cr film having a thickness of 100 nm was deposited by using a magnetron sputtering method whereby a high dielectric coating having a sheet resistance of $100\Omega/\square$ was formed.

The substrate 11 (outer dimensions: 6 inches (152 mm) square, thickness: 6.3 mm) was fixed to an ordinary electrostatic chuck having a flat plate shape by utilizing the formed Cr film, and a Si film and a Mo film were deposited on the surface of the substrate 11 alternately in 40 cycles by an ion beam sputtering method, whereby a Si/Mo multilayer reflective film (reflective layer 12) having a total film thickness of 272 nm ((Si film: 4.5 nm+Mo film: 2.3 nm)×40 layers) was formed.

Then, on the Si/Mo multilayer reflective film (the reflective layer 12), a Ru film (film thickness: 2.5 nm) was deposited by using an ion beam sputtering method to thereby form a protection layer 13.

The conditions of depositing Si film, Mo film and Ru film are as follows.

Film-deposition Conditions of Si Film
   Target: Si target (boron-doped)
   Sputtering gas: Ar gas (gas pressure: 0.02 Pa)
   Voltage: 700 V
   Film deposition rate: 0.077 nm/sec
   Film thickness: 4.5 nm
Film-deposition Conditions of Mo Film
   Target: Mo target
   Sputtering gas: Ar gas (gas pressure: 0.02 Pa)
   Voltage: 700 V
   Film deposition rate: 0.064 nm/sec
   Film thickness: 2.3 nm
Film-deposition Conditions of Ru Film
   Target: Ru target
   Sputtering gas: Ar gas (gas pressure: 0.02 Pa)
   Voltage: 500 V
   Film deposition rate: 0.023 nm/sec
   Film thickness: 2.5 nm Then, on the protection layer 13, a PdMo film containing Pd and Mo was formed by using a magnetron sputtering method to form an absorber layer 14.

The absorber layer 14 (PdMo film) was deposited according to the following method. The film composition is measured by an X-ray photoelectron spectrometer (manufactured by PERKIN ELEMER-PHI), a secondary ion mass spectrometer (manufactured by PHI-ATOMIKA) and a Rutherford back scattering spectroscopy (manufactured by Kobe Steel, Ltd.). The composition of the absorber layer is Pd:Mo=62:38. In the composition of the absorber layer 14, O and Ta are not detected.

Film-deposition Conditions of Absorber Layer 14 (PdMo Film)
  Target: Pd target and Mo target
  Sputtering gas: Ar gas (gas pressure: 0.3 Pa)
  Input power: Pd target=50 W, Mo target=100 W
  Film-deposition rate: 18.9 nm/min
  Film thickness: 50 nm With respect to the absorber layer 14 (PdMo film) of the EUV mask blank obtained in the above procedure, the following evaluations (1) to (4) were carried out.

(1) Crystalline State

The crystalline state of the absorber layer 14 (PdMo film) was confirmed by an X-ray diffract meter (manufactured by RIGAKU Corporation). Since no sharp peak was observed in the diffraction peaks obtained, it was confirmed that the crystalline state of the absorber layer 14 was an amorphous structure or a fine crystal structure.

(2) Surface Roughness

The surface roughness of the absorber layer 14 (PdMo film) was measured by an atomic force microscope (manufactured by SII, SPI-3800) in a dynamic force mode. The measurement area of the surface roughness is 1 μm×1 μm, and a cantilever SI-DF40 (manufactured by SII) is employed.

The surface roughness (rms) of the absorber layer 14 was 0.28 nm.

(3) Film Stress

The film stress of the absorber layer 14 (PdMo film) was evaluated by depositing the film on a 4 inch wafer under the same conditions as the above film-deposition conditions and measuring the change of warpage amount of the substrate by the film-deposition. The warpage amount of the substrate was measured by using a stress measurement apparatus (FLX-2320 manufactured by KLA-Tencor). The film stress of the absorber layer 14 was 188 MPa and it was within a film stress range (±200 MPa) required for EUV mask blank.

(4) Optical Coefficients in EUV Wavelength Region

Optical coefficients of the absorber layer 14 (PdMo film) in the EUV wavelength region were evaluated by depositing the film on a 4-inch wafer under the same conditions as the above film-deposition conditions and measuring "angle dependence" of reflectivity in 13.5 nm region. EUV reflectivity, incident angle of EUV light and optical constants are represented by the following formula.

$$R=|(\sin\theta-\sqrt{((n+ik)^2-\cos^2\theta)})/(\sin\theta+\sqrt{((n+ik)^2-\cos^2\theta)})|$$

Here, θ is an incident angle of EUV light, R is an EUV reflectivity at the incident angle θ, n is the refractive index of an absorber layer 14, and k is the extension coefficient of the absorber layer 14. By fitting the measurement value of the reflectivity at each EUV incident angle by using the above formula, it is possible to assume optical constants (n and k). As a result of measurement, the optical constants of the absorber layer 14 were n=0.8911 and k=0.0322, and it was confirmed that these optical constants were within desired ranges for reducing the thickness of the absorber layer.

Next, a low-reflective layer 15 (PdMoON film) containing Pd, Mo, O and N was formed on the absorber layer 14 by using a magnetron sputtering method to obtain an EUV mask blank 1 comprising a substrate 11 and a reflective layer 12, a protection layer 13, an absorber layer 14 and a low-reflective layer 15 formed in this order on the substrate 11.

The film-deposition conditions of the low-reflective layer 15 (PdMoON film) are as follows.

Film-deposition Conditions of Low-reflective Layer 15 (PdMoOn Film)
  Target: Pd target and Mo target
  Sputtering gas: Mixed gas of Ar, $O_2$ and $N_2$ (Ar: 50 vol %, $O_2$: 36 vol %, $N_2$: 14 vol %, gas pressure: 0.3 Pa)
  Input power: Pd target=50 W, Mo target=100 W
  Film-deposition rate: 10.0 nm/min
  Film thickness: 10 nm With respect to the low-reflective layer 15 (PdMoON film) of the EUV mask blank obtained in the above procedure, the following evaluations (1) to (4) were carried out.

(1) Film Composition

The composition of the low-reflective layer 15 (PdMoON film) is measured by using an X-ray photoelectron spectrometer (manufactured by PERKIN ELEMER-PHI) and a Rutherford backscattering spectroscopy (manufactured by Kobe Steel, Ltd.). The composition ratio (at %) of the low-reflective layer is Pd:Mo:O:N=21:14:55:10.

(2) Crystalline State

The crystalline state of the low-reflective layer 15 (PdMoON film) was confirmed by an X-ray Diffractmeter (manufactured by RIGAKU Corporation). Since no sharp peak was observed in diffraction peaks obtained, it was confirmed that the crystalline state of the low-reflective layer 15 (PdMoON film) was an amorphous structure or a fine crystal structure.

(3) Surface Roughness

The surface roughness of the low-reflective layer 15 (PdMoON film) is measured by an atomic force microscope (SPI-3800 manufactured by SII) in a dynamic force mode. The measurement area of the surface roughness is 1 μm×1 μm, and SI-DF40 (manufactured by SII) is used as a cantilever. The surface roughens (rms) of the low-reflective layer is 0.30 nm.

(4) Reflection Characteristic Evaluation (Contrast Evaluation)

In this Example, in a stage that layers up to the protection layer 13 (Ru film) have been formed, the reflectivity of a surface of the protection layer 13 for mask pattern inspection light (wavelength 257 nm) is measured by using a spectrophotometer (HITACHI UV-4100). Further, after the low-reflective layer 15 (PdMoON film) is formed, the reflectivity of the surface the low-reflective layer for mask pattern inspection light is measured. As a result, the reflectivity of the surface of the protection layer13 at wavelength 257 nm is 56.0%. On the other hand, a surface of the low-reflective layer 15 (PdMoON film) at wavelength 257 nm is 8.9% that is lower than 15%. From these results and the above formula, the contrast at wavelength 257 nm becomes 72.6%.

At the wavelength of mask pattern inspection light, the contrast between the surface of the protection layer 13 and the surface of the low-reflective layer 15 is at least 70%, and a sufficient contrast is obtained. With respect to the EUV mask blank 1 is obtained, EUV light (wavelength 13.5 nm) is incident into the surface of the low-reflective layer 15 to measure the reflectivity for EUV light. As a result, the reflectivity for EUV light is 4.3%, and the EUV reflectivity is sufficient for obtaining a phase shift effect.

Example 2

Example 2 is the same as Example 1 except that the absorber layer 14 is a PdAg film. The film-deposition conditions of the absorber layer 14 (PdAg film) are as follows. The film composition is measured by a method similar to that Example 1. The composition of the absorber layer 14 is Pd:Ag=42:58. In the composition of the absorber layer 14, O and Ta are not detected.

Film-deposition Conditions of Absorber Layer 14 (PdAg Film)
  Target: Pd target and Ag target
  Sputtering gas: Ar gas (gas pressure: 0.3 Pa)
  Input power: Pd target=100 W, Sn target=100 W
  Film-deposition rate: 42.1 nm/min
  Film thickness: 50 nm With respect to the absorber layer 14 (PdAg film) of the EUV mask blank obtained by the above procedure, the crystalline state was checked by a method similar to that of Example 1, and as a result, it was confirmed that the crystalline state of the absorber layer 14 was an amorphous structure or a fine crystal structure.

Further, the surface roughness of the absorber layer 14 is checked in the same manner as in Example 1. The surface roughness (rms) of the absorber layer 14 is 0.30 nm.

Further, the film stress of the absorber layer 14 (PdAg film) was checked by a method similar to that of Example 1, and as a result, the film stress was −46.8 MPa that was within a film stress range (±200 MPa) required to an EUV mask blank.

Further, optical constants of the absorber layer 14 (PdAg film) in the EUV wavelength region were checked by a method similar to that of Example 1, and as a result, it was confirmed that n=0.8806 and k=0.0601 that were within desired ranges for reducing the thickness of the absorber layer.

Next, on the absorber layer 14, a low-reflective layer 15 (PdAgON film) containing Pd, Ag, O and N is formed by using a magnetron sputtering method, thereby to obtain an EUV mask blank 1 comprising a substrate 11 and a reflective layer 12, a protection layer 13, an absorber layer 14 and a low-reflective layer 15 formed in this order on the substrate 11.

The film-deposition conditions of the low-reflective layer 15 (PdAgON film) are as follows.

Film-deposition Conditions of Low-reflective Layer 15 (PdAgON Film)
  Target: Pd target and Ag target
  Sputtering gas: Mixed gas of Ar, $O_2$ and $N_2$ (Ar: 50 vol %, $O_2$: 36 vol %, $N_2$: 14 vol %, gas pressure: 0.3 Pa)
  Input power: Pd target=100 W, Ag target=100 W
  Film-deposition rate: 20.1 nm/min
  Film thickness: 10 nm The film composition of the low-reflective layer 15 (PdAgON film) of the EUV mask blank obtained by the above procedure is measured by a method similar to that of Example 1. The film composition of the low-reflective layer 15 is Pd:Ag:O:N=18:23:47:12.

The crystalline state of the low-reflective layer 15 (PdAgON film) is checked by a method similar to that of Example 1. The crystalline state of the low-reflective layer 15 is an amorphous structure or a fine crystal structure. Further, the surface roughness of the low-reflective layer 15 is checked in the same manner as in Example 1. The surface roughness (rms) of the low-reflective layer 15 is 0.32 nm.

The reflection characteristic of the low-reflective layer 15 (PdAgON) is checked by a method similar to that of Example 1. The reflectivity for mask pattern inspection light (wavelength 257 nm) is 8.1% that is within the range of equal to or lower than 15%.

Since the reflectivity of the surface of the protection layer 13 at wavelength 257 nm is 56.0%, the contrast at wavelength 257 nm is 74.7%. With respect to the wavelength of mask pattern inspection light, the contrast between the surface of the protection layer 13 and the surface of the low-reflective layer 15 is at least 70%, and a sufficient contrast is obtained. With respect to the EUV mask blank 1 obtained, EUV light (wavelength 13.5 nm) is incident into a surface of the low-reflective layer 15 (PdSnON film) to measure the reflectivity for EUV light. As a result, the reflectivity for EUV light is 2.4%, that is sufficient for obtaining a phase shift effect.

Example 3

Example 3 is the same as Example 1 except that the absorber layer 14 is a PdSn film. The film-deposition conditions of the absorber layer 14 (PdSn film) are as follows. The film composition is measured by a method similar to that of Example 1. The composition of the absorber layer 14 is Pd:Sn=18:82. In the composition of the absorber layer 14, O and Ta are not detected.

Film-deposition Conditions of Absorber Layer 14 (PdSn Film)
  Target: Pd target and Sn target
  Sputtering gas: Ar gas (gas pressure: 0.3 Pa)
  Input power: Pd target=100 W, Sn target=150 W
  Film-deposition rate: 46.9 nm/min
  Film thickness: 50 nm With respect to the absorber layer 14 (PdSn film) of the EUV mask blank obtained by the above procedure, the crystalline state was checked by a method similar to that of Example 1, and as a result, it was confirmed that the crystalline state of the absorber layer 14 (PdSn film) is an amorphous structure or a fine crystal structure.

Further, the surface roughness of the absorber layer 14 (PdSn film) was checked in the same manner as in Example 1, and as a result, the surface roughness (rms) of the absorber layer 14 was 0.19 nm.

Further, the film stress of the absorber layer 14 (PdSn film) was checked by a method similar to that of Example 1, and as a result, film stress was −100.6 MPa that was within a film stress range (±200 MPa) required to an EUV mask blank.

Further, optical constants of the absorber layer 14 (PdSn film) in the EUV wavelength region were checked by a method similar to that of Example 1, and as a result, it was confirmed that n=0.8951 and k=0.0625 that were within desired ranges for reducing the thickness of the absorber layer.

Next, on the absorber layer 14, a low-reflective layer 15 (PdSnON film) containing Pd, Sn, O and N is formed by using a magnetron sputtering method, thereby to obtain an EUV mask blank 1 comprising a reflective layer 12, a protection layer 13, an absorber layer 14 and a low-reflective layer 15 formed in this order on the substrate 11.

The film-deposition conditions of the low-reflective layer 15 (PdSnON film) are as follows.

Film-deposition Conditions of Low-reflective Layer 15 (PdSnOn Film)
  Target: Pd target and Sn target
  Sputtering gas: Mixed gas of Ar, $O_2$ and $N_2$ (Ar: 50 vol %, $O_2$: 36 vol %, $N_2$: 14 vol %, gas pressure: 0.3 Pa)
  Input power: Pd target=100 W, Sn target=150 W
  Film-deposition rate: 30.2 nm/min
  Film thickness: 10 nm The film composition of the low-reflective layer 15 (PdSnON film) of the EUV mask blank obtained by the above procedure is measured by a method similar to that of Example 1. The film composition of the low-reflective layer 15 is Pd:Sn:O:N=10:25:50:15.

The crystalline state of the low-reflective layer 15 (PdSnON film) is checked by a method similar to that of Example 1. The crystalline state of the low-reflective layer 15 is an amorphous structure or a fine crystal structure.

Further, the surface roughness of the low-reflective layer 15 (PdSnON film) is checked in the same manner as in Example 1. The surface roughness (rms) of the low-reflective layer 15 is 0.28 nm.

The reflection characteristic of the low-reflective layer 15 (PdSnON) is checked by a method similar to that of Example 1. The reflectivity for mask pattern inspection light (wavelength 257 nm) is 14% that is within the range of equal to or lower than 15%.

Since the reflectivity of the surface of the protection layer 13 at wavelength 257 nm is 56.0%, the contrast at wavelength 257 nm is 60%. With respect to the wavelength of mask pattern inspection light, the contrast between the surface of the protection layer 13 and the surface of the low-reflective layer 15 is at least 60%, and a sufficient contrast is obtained. With respect to the EUV mask blank 1 obtained, EUV light (wavelength 13.5 nm) is incident into a surface of the low-reflective layer 15 (PdSnON film) to measure the reflectivity for EUV light. As a result, the reflectivity for EUV light is 2.3%, that is sufficient for obtaining a phase shift effect.

Example 4

Example 4 is the same as Example 1 except that the absorber layer 14 is a PdSnN film. The film-deposition conditions of the absorber layer 14 (PdSnN film) are as follows. The film composition is measured by a method similar to that Example 1. The composition of the absorber layer 14 is Pd:Sn:N=12:41:47. In the composition of the absorber layer 14, O and Ta are not detected.

Film-deposition Conditions of Absorber Layer 14 (PdSnN Film)
  Target: Pd target and Sn target
  Sputtering gas: Mixed gas of Ar gas and $N_2$ (Ar: 86.0 vol %, $N_2$: 14 vol %, gas pressure: 0.3 Pa)
  Input power: Pd target=100 W, Sn target=150 W
  Film-deposition rate: 28.4 nm/min
  Film thickness: 50 nm With respect to the absorber layer 14 (PdSnN film) of the EUV mask blank obtained by the above procedure, the crystalline state was checked by a method similar to that of Example 1, and as a result, it was confirmed that the crystalline state of the absorber layer 14 was an amorphous structure or a fine crystal structure.

Further, the surface roughness of the absorber layer 14 was checked in the same manner as in Example 1, and as a result, the surface roughness (rms) of the absorber layer 14 was 0.13 nm.

Further, the film stress of the absorber layer 14 (PdSnN film) was checked by a method similar to that of Example 1, and as a result, the film stress was −83.2 MPa that was within a film stress range (±200 MPa) required to an EUV mask blank.

Further, optical constants of the absorber layer 14 (PdSnN film) in the EUV wavelength region were checked by a method similar to that of Example 1, and as a result, it was confirmed that n=0.8990 and k=0.0709 that were within desired ranges for reducing the thickness of the absorber layer.

Next, on the absorber layer 14, a low-reflective layer 15 (PdSnON film) is deposited in the same manner as in Example 3 to obtain an EUV mask blank 1 comprising a substrate 11 and a reflective layer 12, a protection layer 13, an absorber layer 14 and a low-reflective layer 15 formed in this order on the substrate 11.

The film composition and the crystalline structure of the low-reflective layer 15 (PdSnON film) are similar to those of Example 3. Further, the surface roughness of the low-reflective layer 15 is checked in the same manner as Example 1. The surface roughness (rms) of the low-reflective layer 15 is 0.27 nm.

The reflection characteristic of the low-reflective layer 15 (PdSnON) is checked by a method similar to that of Example 1. The reflectivity for mask pattern inspection light (wavelength 257 nm) is 14% that is within the range of equal to or lower than 15%.

Since the low reflectivity of the surface of the protection layer at wavelength 257 nm is 56.0%, the contrast at wavelength 257 nm is 60%. With respect to the wavelength of mask pattern inspection light, the contrast between the surface of the protection layer 13 and the surface of the low-reflective layer 15 is at least 60%, and a sufficient contrast is obtained. With respect to the EUV mask blank 1 obtained, EUV light (wavelength 13.5 nm) is incident into a surface of the low-reflective layer 15 (PdSnON film) to measure the reflectivity for EUV light. As a result, the reflectivity for EUV light is 2.1%, that is sufficient for obtaining a phase shift effect.

Example 5

Example 5 is the same as Example 3 except that the low-reflective layer 15 is TaON. A low-reflective layer 15 (TaON film) containing Ta, O and N is deposited on an absorber layer 14 (PdSn) by using a magnetron sputtering method, to obtain an EUV mask blank 1 comprising a substrate 11 and a reflective layer 12, a protection layer 13, an absorber layer 14 and a low-reflective layer 15 formed in this order on the substrate 11.

The film-deposition conditions of the low-reflective layer 15 are as follows.

Film-deposition Conditions of Low-reflective Layer 15 (TaOn Filmy
  Target: Ta target
  Sputtering gas: Mixed gas of Ar, $N_2$ and $O_2$ (Ar: 36 vol %, $N_2$: 14 vol %, $O_2$: 50 vol %, gas pressure: 0.3 Pa)
  Input power: 450 W
  Film-deposition rate: 0.28 nm/min
  Film thickness: 10 nm The composition ratio (at %) of the low-reflective layer is measured in the same manner as Example 1, and as a result, Ta:N:O=22.1:4.4:73.5.

The crystalline state of the low-reflective layer 15 (TaON film) is measured by a method similar to that of Example 1. The crystalline state of the low-reflective layer 15 is an amorphous structure or a fine crystal structure.

Further, the surface roughness of the low-reflective layer 15 (TaON film) is checked in the same manner as Example 1. The surface roughness (rms) of the low-reflective layer 15 is 0.28 nm.

The reflection characteristic of the low-reflective layer 15 (TaON) is checked by a method similar to that of Example 1. The reflectivity of the mask pattern inspection light (wavelength 257 nm) is 3.3% that is within the range of equal to or lower than 15%.

Since the reflectivity of the surface of the protection layer 13 at wavelength 257 nm is 56.0%, the contrast at wavelength 257 nm is 89.0%. The contrast between the surface of the protection layer 13 and the surface of the low-reflective layer 15 at the wavelength of mask pattern inspection light is at least 70%, and a sufficient contrast is obtained. With respect to the EUV mask blank 1 obtained, EUV light (wavelength 13.5 nm) is incident into the low-reflective layer 15 (TaON film) to measure the reflectivity for EUV light. As a result, the reflectivity for EUV light is 2.3% that is a sufficient EUV reflectivity for obtaining a phase shift effect.

Example 6

Example 6 is the same as Example 3 except that the low-reflective layer 15 is SiN. A low-reflective layer 15 (SiN film) containing Si and N is formed on an absorber layer 14 (PdSn) by using a magnetron sputtering method, to obtain an EUV mask blank 1 comprising a substrate 11 and a reflective layer 12, a protection layer 13, an absorber layer 14 and a low-reflective layer 15 formed in this order on the substrate 11.

The film-deposition conditions of the low-reflective layer 15 are as follows.

Film-deposition Conditions of Low-reflective Layer 15 (SiN Film)
 Target: Si target
 Sputtering gas: Mixed gas of Ar and $N_2$ (Ar: 20 vol %, $N_2$: 80 vol %, gas pressure: 0.3 Pa)
 Input power: 150 W
 Film-deposition rate: 2 nm/min
 Film thickness: 12 nm The composition ratio (at %) of the low-reflective layer was measured by a method similar to that of Example 1, and as a result, it is Si:N=34:66.

The crystalline state of the low-reflective layer 15 (SiN film) is checked by a method similar to that of Example 1. The crystalline state of the low-reflective layer 15 is an amorphous structure or a fine crystal structure.

Further, the surface roughness of the low-reflective layer 15 (SiN film) is checked in the same manner as Example 1. The surface roughness (rms) is 0.30 nm.

The reflection characteristic of the low-reflective layer 15 (SiN film) is checked by a method similar to that of Example 1. The reflectivity for mask pattern inspection light (wavelength 257 nm) is 8.4% that is within the range of equal to or lower than 15%.

Since the reflectivity of the surface of the protection layer 13 at wavelength 257 nm is 56.0%, the contrast at wavelength 257 nm is 73.9%. At the wavelength of mask pattern inspection light, the contrast between the surface of the protection layer 13 and the surface of the low-reflective layer 15 is at least 70%, and a sufficient contrast is obtained. With respect to the EUV mask blank 1 obtained, EUV light (wavelength 13.5 nm) is incident into the surface of the low-reflective layer 15 (SiN film) to measure the reflectivity for EUV light. As a result, the reflectivity for EUV light is 3.3% that is a sufficient EUV reflectivity for obtaining a phase shift effect.

Example 7

Example 7 is the same as Example 3 except that the low-reflective layer 15 is HfON. A low-reflective layer 15 (HfON film) containing Hf, N and O is formed on the absorber layer 14 (PdSn) by using a magnetron sputtering method, to obtain an EUV mask blank 1 comprising a substrate 11 and a reflective layer 12, a protection layer 13, an absorber layer 14 and a low-reflective layer 15 formed in this order on the substrate 11.

The film-deposition conditions of the low-reflective layer 15 are as follows.

Film-deposition Conditions of Low-reflective Layer 15 (HfOn Film)
 Target: Hf target
 Sputtering gas: Mixed gas of Ar, $N_2$ and $O_2$ (Ar: 45 vol %, $N_2$: 23 vol %, $O_2$: 32 vol %, gas pressure: 0.3 Pa)
 Input power: 150 W
 Film-deposition rate: 7.8 nm/min
 Film thickness: 13 nm The composition ratio (at %) of the low-reflective layer was measured by a method similar to that of Example 1, and as a result, it is Hf:N:O=50:15:35.

The crystalline state of the low-reflective layer 15 (HfON film) is checked by a method similar to that of Example 1. The crystalline state of the low-reflective layer 15 is an amorphous structure or a fine crystal structure.

Further, the surface roughness of the low-reflective layer 15 (HfON film) is checked in the same manner as Example 1. The surface roughness (rms) of the low-reflective layer 15 is 0.29 nm.

The reflection characteristic of the low-reflective layer 15 (HfON film) is checked by a method similar to that of Example 1. The reflectivity for mask pattern inspection light (wavelength 257 nm) is 10.9% that is within the range of equal to or lower than 15%.

Since the reflectivity of the surface of the protection layer 13 at wavelength 257 mm is 56.0%, the contrast at wavelength 257 nm is 67.4%. At the wavelength of mask pattern inspection light, the contrast between the surface of the protection layer 13 and the surface of the low-reflective layer 15 is at least 60% and a sufficient contrast is obtained. With respect to the EUV mask blank 1 obtained, EUV light (wavelength 13.5 nm) is incident into a surface of the low-reflective layer 15 (SiN film) to measure the reflectivity for EUV light. As a result, the reflectivity for EUV light is 2.5%, that is a sufficient EUV reflectivity for obtaining a phase shift effect.

Comparative Example 1

Comparative Example 1 is the same as Example 1 except that the absorber layer 14 is a TaN film. The film-deposition conditions of the absorber layer 14 (TaN film) are as follows. The film composition is measured by a method similar to that of Example 1. The composition of the absorber layer 14 is Ta:N=55:45.

Film-deposition Conditions of TaN Layer
 Target: Ta target
 Sputtering gas: Mixed gas of Ar and $N_2$ (Ar: 86 vol %, $N_2$: 14 vol %, gas pressure: 0.37 Pa)
 Input power: 300 W
 Film-deposition rate: 1.1 nm/min
 Film thickness: 60 nm With respect to the absorber layer 14 (TaN film) of an EUV mask blank obtained by the above procedure, the crystalline state is checked by a method similar to that of Example 1, and as a result, a sharp peak is observed in diffraction peaks obtained, which confirms that the absorber layer is crystalline. Further, the surface roughness of the absorber layer 14 was checked in the same manner as Example 1, and as a result, the surface roughness (rms) of the absorber layer 14 was 0.35 nm.

Further, the film stress of the absorber layer 14 (TaN film) was checked by a method similar to that of Example 1, and as a result, the film stress was −3456 MPa that is larger than the film stress range (within ±200 MPa) required to an EUV mask blank, and it is concerned that the shape accuracy or the dimension accuracy of a mask transcription pattern transcribed into a resist on a substrate such as a Si wafer are deteriorated.

Further, the optical constants of the absorber layer 14 (TaN film) in the EUV wavelength region were checked by a method similar to that of Example 1, and as a result, n=0.947 and k=0.0351. Accordingly, since the value of n is larger than that of an absorber layer (having optical constants n=0.945 and k=0.351) containing Ta as the main component that is presently commonly employed, the effect of reducing the thickness of the absorber layer 14 cannot be obtained.

As described above, an absorber layer 14 containing Ta is not preferred for the reason that the film stress is large and that the effect of reducing the film thickness is small.

Comparative Example 2

Comparative Example 2 is the same as Example 1 except that the absorber layer 14 is a PdTa film. The film-deposition conditions of the absorber layer 14 (PdTa film) are as follows. The film composition is measured by a method similar to that of Example 1. The composition of the absorber layer 14 is Pd:Ag=35:65.

Film-deposition Conditions of Absorber Layer 14 (PdTa Film)
  Target: Pd target and Ta target
  Sputtering gas: Ar gas (gas pressure: 0.3 Pa)
  Input power: Pd target=30 W and Ta target 150 W
  Film-deposition rate: 16.1 nm/min
  Film thickness: 50 nm With respect to the absorber layer 14 (PdTa film) of the EUV mask blank obtained by the above procedure, the crystalline state was checked by a method similar to that of Example 1, and as a result, it was confirmed that the crystalline state of the absorber layer 14 was an amorphous structure or a fine crystal structure. Further, the surface roughness of the absorber layer 14 was checked in the same manner as Example 1, and as a result, the surface roughness (rms) of the absorber layer 14 was 0.28 nm.

Further, the film stress of the absorber layer 14 (PdTa film) was checked by a method similar to that of Example 1, and as a result, the film stress was −867.8 MPa that is larger than the film stress range (within ±200 MPa) required for an EUV mask blank, and it is concerned that the shape accuracy or the dimension accuracy of a mask transcription pattern transcribed into a resist on a substrate such as a Si wafer is deteriorated.

Further, the optical constants of the absorber layer 14 (PdTa film) in the EUV wavelength region were checked by a method similar to that of Example 1, and as a result, that were n=0.9321 and k=0.0373 that are not significantly different from the optical constants (n=0.945 and k=0.351) of an absorber layer containing Ta as the main component that is presently commonly employed, and the effect of reducing the thickness of the absorber layer 14 is small.

As described above, an absorber layer 14 containing Ta is not preferred for the reason that the film stress is large and the effect of reducing the film thickness is small.

INDUSTRIAL APPLICABILITY

With the EUV mask blank of the present invention, it is possible to make the value of the refractive index of the absorber layer smaller than that of a conventional absorber layer containing Ta as the main component and to make the extension coefficient a desired value, and it is possible to make the film thickness smaller than that of a conventional absorber layer. Accordingly, in EUV lithography, it is expected that the shape accuracy or the dimension accuracy of a mask transcription pattern transcribed in a resist on a substrate such as a Si wafer is improved.

REFERENCE SYMBOLS

1: EUV mask blank
11: Substrate
12: Reflective layer (multilayer reflective film)
13: Protection layer
14: Absorber layer
15: Low-reflective layer

What is claimed is:

1. A reflective mask blank for EUV lithography comprising a substrate and a reflective layer for reflecting EUV light and an absorber layer for absorbing EUV light, that are formed in this order on the substrate;
  wherein the absorber layer contains at least one element selected from the group consisting of molybdenum (Mo), tin (Sn), silver (Ag), niobium (Nb) and titanium (Ti), and the absorber layer further contains palladium (Pd).

2. The reflective mask blank for EUV lithography according to claim 1, wherein in the absorber layer, the total content of molybdenum (Mo), tin (Sn), silver (Ag), niobium (Nb) and titanium (Ti) is from 20 to 90 at %, the content of palladium (Pd) is from 10 to 80 at %, and the total content of Mo, Sn, Ag, Nb, Ti and Pd is from 95 to 100 at %.

3. The reflective mask blank for EUV lithography according to claim 1, wherein the absorber layer further contains nitrogen (N).

4. The reflective mask blank for EUV lithography according to claim 3, wherein in the absorber layer, the total content of molybdenum (Mo), tin (Sn), silver (Ag), niobium (Nb) and titanium (Ti) is from 20 to 90 at %, the content of palladium (Pd) is from 10 to 80 at %, the content of nitrogen (N) is from 30 to 70 at %, and the total content of Mo, Sn, Ag, Nb, Ti, Pd and N is from 95 to 100 at %.

5. The reflective mask blank for EUV lithography according to claim 1, wherein the absorber layer further contains hydrogen (H).

6. The reflective mask blank for EUV lithography according to claim 5, wherein in the absorber layer, the total content of molybdenum (Mo), tin (Sn), silver (Ag), niobium (Nb) and titanium (Ti) is from 20 to 90 at %, the content of palladium (Pd) is from 10 to 80 at %, the content of hydrogen (H) is from 0.1 to 10 at %, and the total content of Mo, Sn, Ag, Nb, Ti, Pd and H is from 95 to 100 at %.

7. The reflective mask blank for EUV lithography according to claim 1, wherein the absorber layer further contains nitrogen (N) and hydrogen (H).

8. The reflective mask blank for EUV lithography according to claim 7, wherein in the absorber layer, the total content of molybdenum (Mo), tin (Sn), silver (Ag), niobium (Nb) and titanium (Ti) is from 20 to 90 at %, the content of palladium (Pd) is from 10 to 80 at %, the content of nitrogen (N) is from 30 to 70 at %, the content of hydrogen (H) is from 0.1 to 10 at %, and the total content of Mo, Sn, Ag, Nb, Ti, Pd, N and H is from 95 to 100 at %.

9. The reflective mask blank for EUV lithography according to claim 1, wherein the crystalline state of the absorber layer is amorphous.

10. The reflective mask blank for EUV lithography according to claim 1, wherein the surface roughness (rms) of the surface of the absorber layer is at most 0.5 nm.

11. The reflective mask blank for EUV lithography according to claim 1, wherein the thickness of the absorber layer is from 20 to 50 nm.

12. The reflective mask blank for EUV lithography according to claim 1, which further comprises a low-reflective layer for inspection light to be used for inspection of mask pattern, that is formed on the absorber layer,
  wherein the low-reflective layer contains at least one element selected from the group consisting of molybdenum (Mo), tin (Sn), silver (Ag), niobium (Nb) and titanium (Ti), and the low-reflective layer further contains palladium (Pd) and oxygen (O).

13. The reflective mask blank for EUV lithography according to claim 12, wherein in the low-reflective layer, the total content of molybdenum (Mo), tin (Sn), silver (Ag), niobium (Nb) and titanium (Ti) is from 10 to 55 at %, the content of palladium (Pd) is from 10 to 60 at %, the content of oxygen (O) is from 20 to 70 at %, and the total content of Mo, Sn, Ag, Nb, Ti, Pd and O is from 95 to 100 at %.

14. The reflective mask blank for EUV lithography according to claim 1, which further comprises a low-reflective layer for inspection light to be used for inspection of mask pattern, that is formed on the absorber layer, wherein the low-reflective layer contains at least one element selected from the group consisting of molybdenum (Mo), tin (Sn), silver (Ag), niobium (Nb) and titanium (Ti), and the low-reflective layer further contains palladium (Pd), nitrogen (N) and oxygen (O).

15. The reflective mask blank for EUV lithography according to claim 14, wherein in the low-reflective layer, the total content of molybdenum (Mo), tin (Sn), silver (Ag), niobium (Nb) and titanium (Ti) is from 10 to 55 at %, the content of palladium (Pd) is from 10 to 60 at %, the total content of nitrogen (N) and oxygen (O) is from 20 to 70 at %, the composition (atomic) ratio between N and O is N:O=9:1 to 1:9 and the total content of Mo, Sn, Ag, Nb, Ti, Pd, N and O is from 95 to 100 at %.

16. The reflective mask blank for EUV lithography according to claim 1, which further comprises a low-reflective layer for inspection light to be used for inspection of mask pattern, that is formed on the absorber layer,
wherein the low-reflective layer contains at least one element selected from the group consisting of tantalum (Ta), silicon (Si) and hafnium (Hf) and the low-reflective layer further contains at least one element selected from the group consisting of oxygen (O) and nitrogen (N).

17. The reflective mask blank for EUV lithography according to claim 16, wherein in the low-reflective layer, the total content of tantalum (Ta), silicon (Si) and hafnium (Hf) is from 10 to 55 at %, the content of oxygen (O) and nitrogen (N) is from 45 to 90 at % and the total content of Ta, Si, Hf, O and N is from 95 to 100 at %.

18. The reflective mask blank for EUV lithography according to claim 12, wherein the surface roughness (rms) of the low-reflective layer is at most 0.5 nm.

19. The reflective mask blank for EUV lithography according to claim 12, wherein the thickness of the low-reflective layer is from 5 to 30 nm.

20. The reflective mask blank for EUV lithography according to claim 12, which further comprises a protection layer for protecting the reflective layer at a time of patterning the absorber layer, that is formed between the reflective layer and the absorber layer,
wherein the contrast between a reflected light from a surface of the protection layer and a reflected light from a surface of the low-reflective layer at the wavelength of light to be used for inspection of a pattern formed in the absorber layer, is at least 30%.

21. The reflective mask blank for EUV lithography according to claim 12, wherein the reflectivity of a surface of the low-reflective layer at the wavelength of light to be used for inspection of a pattern formed in the absorber layer is at most 15%.

22. A reflective mask blank for EUV lithography, comprising the reflective mask blank for EUV lithography as defined in claim 1, wherein the absorber layer and the low-reflective layer are patterned.

23. A process for producing a semiconductor integrated circuit, which comprises producing a semiconductor integrated circuit by carrying out an exposure of an object to be exposed by using the reflective mask for EUV lithography as defined in claim 22.

* * * * *